(12) United States Patent
He et al.

(10) Patent No.: US 11,709,979 B1
(45) Date of Patent: Jul. 25, 2023

(54) BRIDGE DAMAGE IDENTIFICATION METHOD CONSIDERING UNCERTAINTY

(71) Applicant: Hefei University of Technology, Hefei (CN)

(72) Inventors: Wenyu He, Hefei (CN); Zhidong Li, Hefei (CN); Jing Zhang, Hefei (CN); Dong Yang, Hefei (CN); Zuocai Wang, Hefei (CN)

(73) Assignee: HEFEI UNIVERSITY OF TECHNOLOGY, Hefei (CN)

( * ) Notice: Subject to any disclaimer, the term of this patent is extended or adjusted under 35 U.S.C. 154(b) by 0 days.

(21) Appl. No.: 17/975,632

(22) Filed: Oct. 28, 2022

(51) Int. Cl.
*G06F 30/23* (2020.01)
*G06N 3/04* (2023.01)
*G06F 30/13* (2020.01)

(52) U.S. Cl.
CPC .............. *G06F 30/23* (2020.01); *G06F 30/13* (2020.01); *G06N 3/04* (2013.01)

(58) Field of Classification Search
CPC ............ G06F 30/23; G06F 30/13; G06N 3/04
See application file for complete search history.

(56) References Cited

U.S. PATENT DOCUMENTS

2016/0034621 A1* 2/2016 Huang .................... G06F 30/23
703/2

FOREIGN PATENT DOCUMENTS

| CN | 106556498 A | 4/2017 |
|----|-------------|--------|
| CN | 109839440 A | 6/2019 |
| CN | 113392986 A | 9/2021 |
| CN | 113567130 A | 10/2021 |

OTHER PUBLICATIONS

M. Y. Choi et al., "Damage Detection System of a Real Steel Truss Bridge by Neural Networks," Smart Systems for Bridges, Structures, and Highways, S. C. Liu. Editor, Proceedings of SPIE vol. 3988 (Year: 2000).*

(Continued)

*Primary Examiner* — Steven W Crabb
(74) *Attorney, Agent, or Firm* — Bayramoglu Law Offices LLC

(57) ABSTRACT

A bridge damage identification method considering uncertainty is used for damage identification based on a convolutional neural network. A domain classifier is added to form a domain adversarial transfer network, a finite element model of a bridge and a time domain acceleration signal of a real structure serve as input, and parameters in a feature extractor are continuously updated in an adversarial process of the domain classifier and the feature extractor, so as to design a brand-new feature extractor, and to achieve a purpose that extracted features are only sensitive to damage. The bridge damage identification method can solve the problem that model-based methods for bridge damage identification are influenced by environment uncertainty or modeling error to generate a difference between the finite element model and the real structure, resulting in reduction in damage identification performance of the method in practical application.

1 Claim, 5 Drawing Sheets

Training stage :

(56) References Cited

OTHER PUBLICATIONS

Jiangpeng Shu et al., "The application of a damage detection method using Artificial Neural Network and train-induced vibrations on a simplified railway bridge model," Engineering Structures 52 (2013) 408-421 (Year: 2013).*

A. C. Neves et al., "Structural health monitoring of bridges: a model-free ANN-based approach to damage detection," J Civil Struct Health Monit (2017) 7:689-702 (Year: 2017).*

He Wen-Yu, et al., Bridge Damage Detection Based on the Moving-vehicle-induced Response and L1 Regularization, China J. Highw. Transp., 2021, pp. 61-70, vol. 34, No. 4.

* cited by examiner

US 11,709,979 B1

BRIDGE DAMAGE IDENTIFICATION METHOD CONSIDERING UNCERTAINTY

CROSS REFERENCE TO THE RELATED APPLICATIONS

This application is based upon and claims priority to Chinese Patent Application No. 202210215447.5, filed on Mar. 7, 2022, the entire contents of which are incorporated herein by reference.

TECHNICAL FIELD

The present invention relates to the field of bridge detection, in particular to a bridge damage identification method considering uncertainty, and the method is more accurate in damage identification and may be used for evaluating the safety state of a bridge structure.

BACKGROUND

A structural health monitoring (SHM) system, important for the safety of a large structure, has a core and most critical part of structural damage identification. Structural damage identification is intended to identify structural damage and use various types of available information to evaluate the condition of the structure. After years of development, there are many effective methods for structural damage identification, and "model-based" methods are commonly used. That is, the entire structure is modeled by using a finite element model and then serves as a benchmark to be compared with an actual structure that may be damaged. The finite element model can also simulate damage by modifying an integrating model, to further understand the impact of damage.

However, the requirements of model computation also become the main bottleneck of its engineering application, and the gap between the finite element model and the actual structure is still large even through a model updating. Therefore, there is a need to consider uncertainty errors in practice. For example, in practical applications, modeling errors and measurement noise are inevitable. These uncertainties may lead to large variations in the damage indicator proposed in the above method.

SUMMARY

In order to overcome the defects in the prior art, the present invention provides a bridge damage identification method considering uncertainty, and aims to solve the problem of difference between a bridge finite element model and a real bridge structure due to environment or modeling errors and obtain a damage identification model with good identification precision. Therefore, the correctness of the model-based damage identification method applied to a real structure is improved.

In order to achieve the objective of the present invention, the following technical solution is used:

(Omitting Duplication)

Compared with the prior art, the present invention has the following beneficial effects:

1. The objective of the present invention is to make the domain adversarial network find common features between the bridge finite element model and the real bridge structure, and the features should be some basic properties of the real bridge structure, such that the actual damage identification performance for the real bridge structure is desirable.

2. The real bridge structure does not need to have damage labels to participate in network training to obtain a classifier. Only a large amount of well-labeled data needs to be obtained from the bridge finite element model, and a satisfactory classifier is trained based on the data, such that the problem that the real bridge structure lacks damage labels is solved.

3. According to the method, not all uncertainty factors in the real bridge structure need to be known, the difference between the real bridge structure and the finite element model may be implicitly related by constructing a partial uncertainty dataset of the bridge finite element model and the real bridge structure, and therefore, modeling of all possible uncertainties in the finite element model may be avoided, and the complexity problem of the real world may be solved.

4. According to the method, only an original acceleration response signal in time domain is needed as input, features related to bridge structure damage may be extracted from the signal without an advanced signal processing tool, so as to achieve efficient bridge damage identification.

DETAILED DESCRIPTION OF THE EMBODIMENTS

Figure 1:
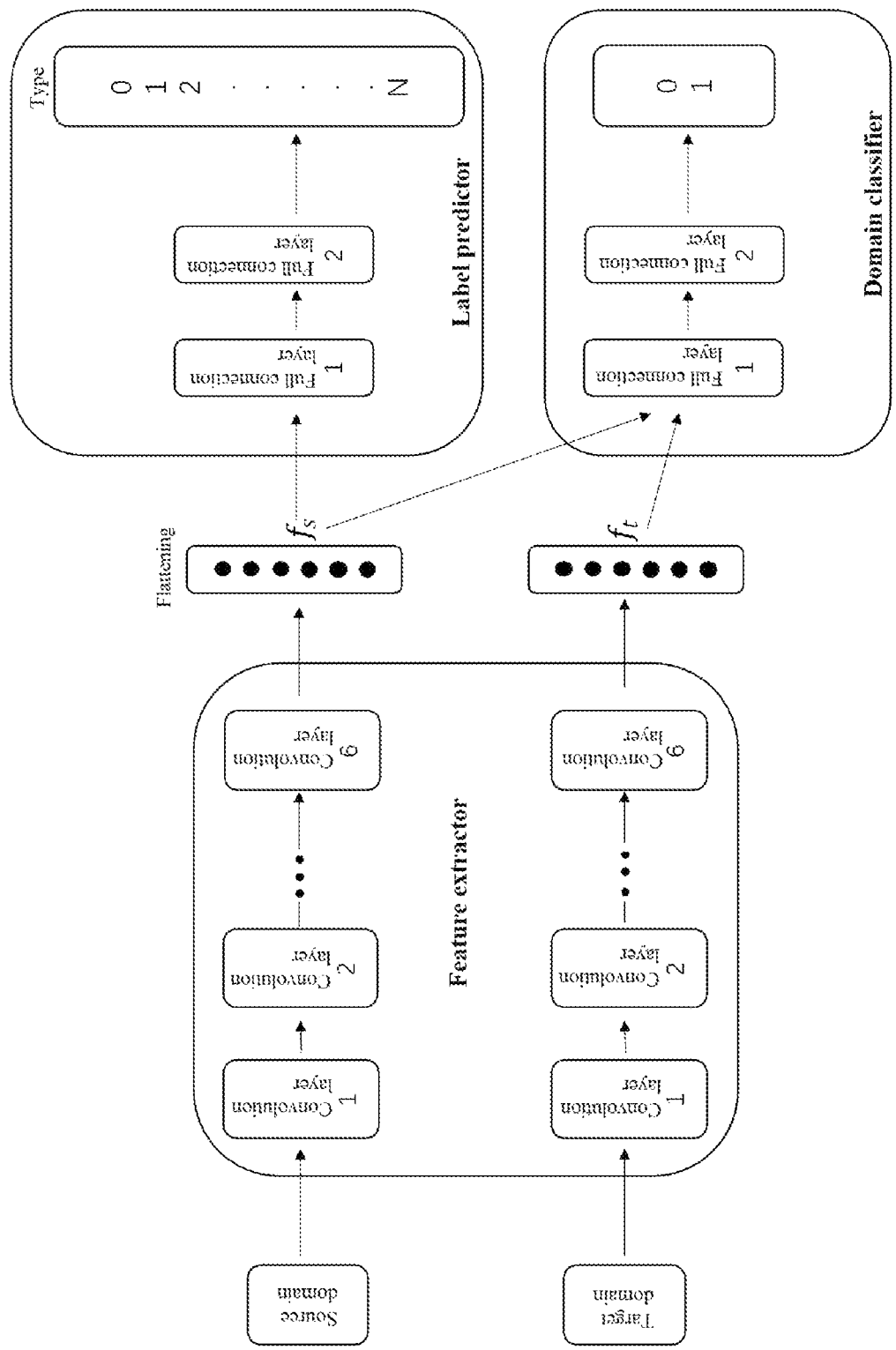
FIG. 1 is a structural diagram of a domain adversarial transfer network in the present invention.
Figure 2:
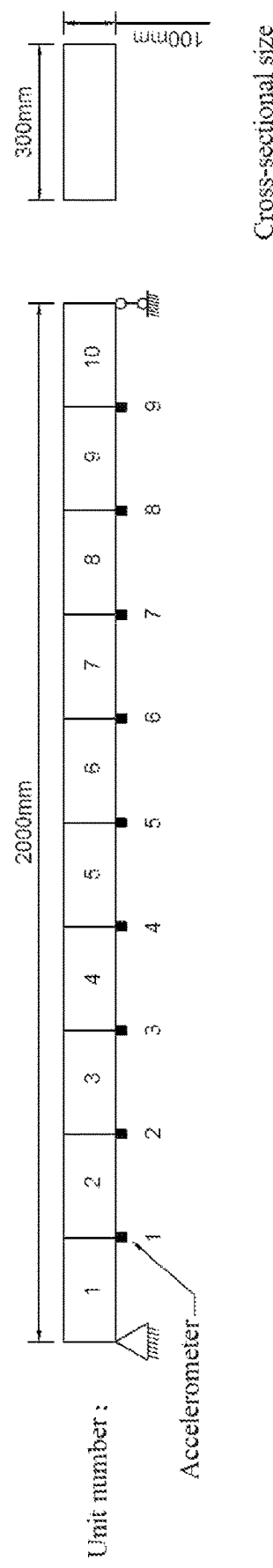
FIG. 2 is a schematic diagram of a numerically simulated simply supported girder bridge in the present invention.
Figure 3:
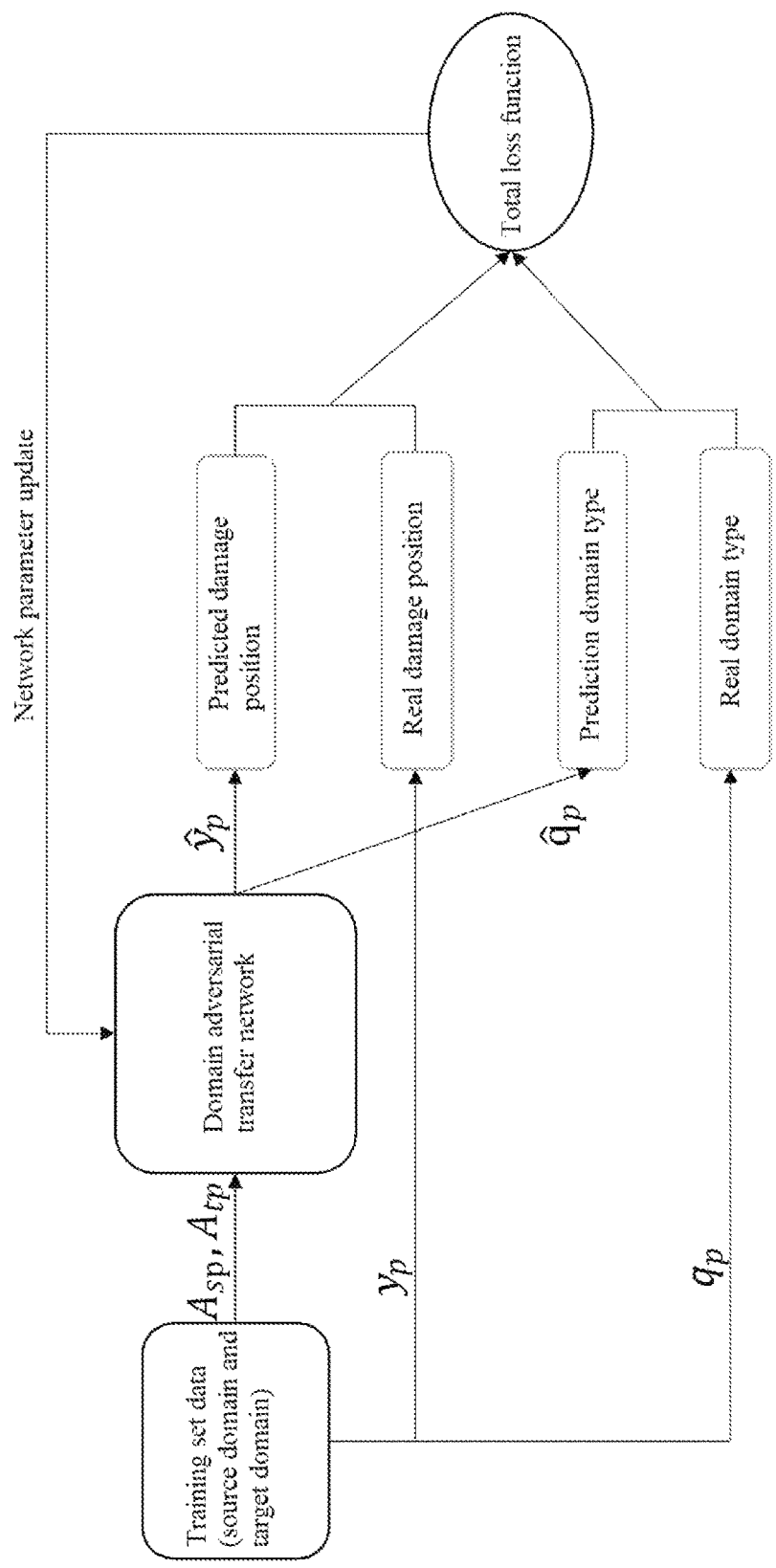
FIG. 3 is a network training flow diagram in the present invention.
Figure 4:
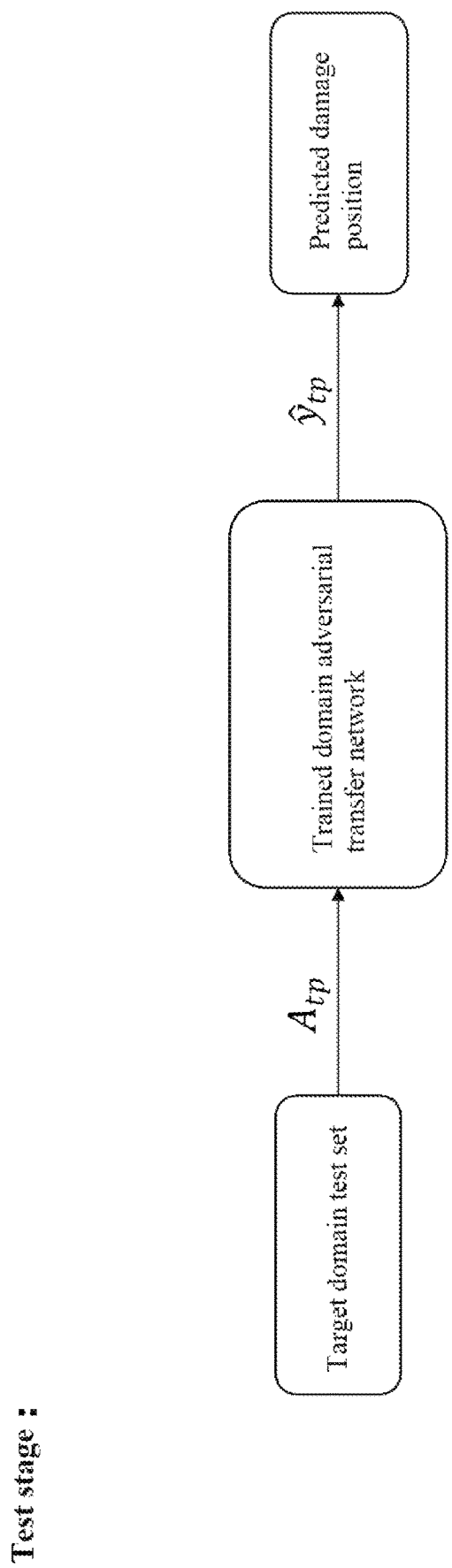
FIG. 4 is a network test flow diagram in the present invention.
Figure 5:
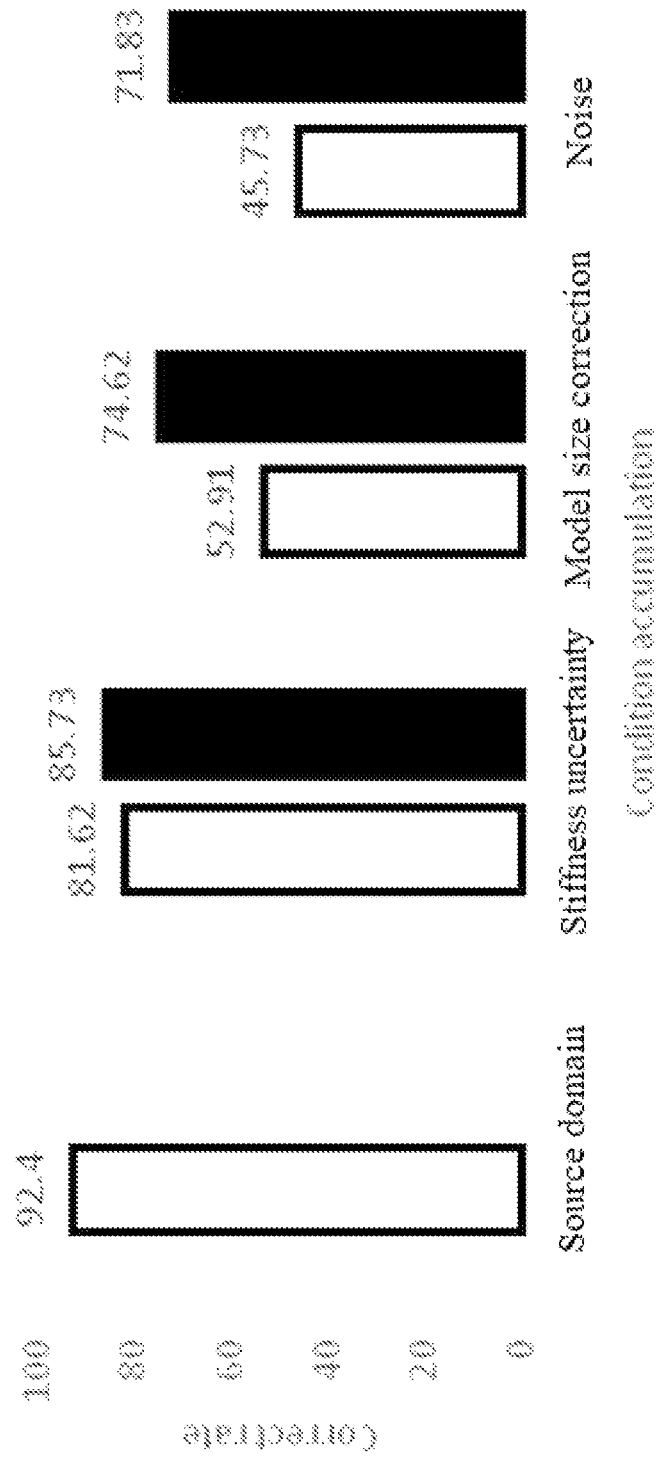
FIG. 5 is a summary graph of results in the present invention.

A structure of a domain adversarial transfer network in the present invention is shown in FIG. 1. In this embodiment, a uniform-section simply supported beam bridge as shown in FIG. 2 has a bridge span length of 2 m, elastic modulus of $3.45 \times 10^{10}$ pa, density of 2420 kg/m$^3$, a cross-section width of 0.3 m, and a height of 0.1 m. A finite element model is established, and the bridge is divided into 10 planar Euler beam elements at equal intervals. A dynamic response of the bridge is computed through a Newmark–$\beta$ method, a sampling frequency is 1024 Hz, a total duration is 5 s. A bridge damage identification method considering uncertainty factors includes:

step 1: construct a bridge acceleration response dataset;

step 1.1: determine a geometric material parameter of a bridge, establish a bridge finite element model, divide the bridge finite element model into units and number the units as [1, 2, 3, . . . , 10] in sequence, number nodes between the elements as [1, 2, 3, . . . , 9] in sequence, and arrange accelerometers at the nodes between the elements;

step 1.2: construct a bridge lossless dataset in a bridge lossless state:

firstly, apply a Gaussian distributed random load once to the node 1, where the random load obeys Gaussian distribution with a mean value of 0 and a standard deviation of 200, and obtain an acceleration response signal matrix $[a_1, \ldots, a_c, \ldots, a_C]^T$ of each node between the elements through a Newmark–$\beta$ method, where $a_c$ is an acceleration response signal with the length of w at the c-th node between the elements, C is the number of the accelerometers, C=n−1, an acceleration signal in this example has a length w=5120, and C=9;

step 1.3: normalize the acceleration response signals of all the nodes, to obtain a normalized acceleration response signal matrix $[\bar{a}_1, \ldots, \bar{a}_c, \ldots, \bar{a}_9]^T$; where $\bar{a}_c$ represents the normalized acceleration response signal at the c-th node;

step 1.4: randomly intercept the normalized acceleration response signal matrix $[\bar{a}_1, \ldots, \bar{a}_c, \ldots, \bar{a}_C]^T$ according to the length $\tilde{w}=1024$, to enhance data diversity, so as to obtain an acceleration response matrix segment $A=[\tilde{a}_1, \ldots, \tilde{a}_c, \ldots, \tilde{a}_9]^T$ of the bridge when the random load is applied to the node 1, and take the segment as a sample; where $\tilde{a}_c$ represents the normalized acceleration response signal with the length of $\tilde{w}$ at the c-th node;

step 1.5, repeatedly apply m times of Gaussian distributed random load to the node 1 between the elements, and performing steps 1.2-1.4 for processing, to obtain m samples, where in order to balance the samples in this example, computation is repeated for m=80 times at each random load position in a lossless state; and step 1.6: process the nodes between the elements in sequence according to steps 1.2-1.5, so as to obtain the acceleration response matrix segment of the bridge when the random load is applied to each node between the elements, where a total of $j_1$=m×(n−1)=80×9=720 samples form the bridge lossless dataset;

step 2: construct a bridge damage dataset:

simulate elemental damage in a mode of reducing stiffness of one element, and set t different reduction coefficients to simulate damage grades, where in this embodiment, t=5 damage grades are set, that is, the stiffness of the element is reduced by 10%, 20%, 30%, 40% and 50%;

step 2.1: select a damage grade at the element 1 for damage simulation, and process each node between the elements according to steps 1.2-1.6 when the element 1 is at the current damage grade, where computation is repeated for m=16 times at each random load position in a lossless state, so as to obtain an acceleration response matrix segment of the bridge under the current damage grade of the element 1;

step 2.2: obtain, according to step 2.1, the acceleration response matrix segments of the bridge under all loss grades of the element 1, with a total of t×(n−1)×m=5×9×16=720 damage samples; and step 2.3: process all the elements in sequence according to steps 2.1-2.2, so as to obtain acceleration response matrix segment samples of the bridge under different loss grades of each element, with a total of $j_2$=t×(n−1)×m×n=720×10=7200 damage samples to form the bridge damage dataset;

step 3: set labels $Y=[y_1, \ldots, y_l, \ldots, y_L]$ for the bridge lossless dataset and the bridge damage dataset, where the $y_l$ represents the label corresponding to the l-th sample, L is the total number of the samples, and $L=j_1+j_2$=720+7200=7920; and $y_l \in [0, 1, 2, \ldots, 10]$, when $y_l$=0, it represents the bridge lossless state corresponding to the l-th sample, and when $y_l$=1, 2, ..., n, it represents a serial number of a damaged unit of the bridge corresponding to the l-th sample;

step 4: combine the bridge lossless dataset and the label thereof with the bridge damage dataset and the label thereof to obtain a source domain dataset S(X,Y) with a label, where X represents a union set of the bridge lossless dataset and the bridge damage dataset, $X=[A_1, \ldots, A_l, \ldots, A_L]$, and $A_l$ represents an l-th combined sample;

step 5: simulate the real bridge structure by adding uncertainty to the bridge finite element model;

step 5.1: take the uncertainty of stiffness of the bridge as a working condition (1), and simulate the working condition (1) by multiplying stiffness of each element of the bridge finite element model by a random factor δ, where the random factor δ obeys Gaussian distribution with a mean value of 1 and a standard deviation of 0.02, then a target domain dataset $T_1(X,Y)$ is obtained according to steps 1 and 2, the target domain is free of labels, and for later verification of an effect of the method, a label is also set here, and Y is the same as the source domain;

step 5.2: take a geometric error and a material error of the bridge as a working condition (2), simulate the material error by changing density and elastic modulus parameters of the bridge finite element model, where the material has density increased by 2% and elastic modulus reduced by 2% in this example, and simulate the geometric error by changing a bridge length, a cross section width and a height of the finite element model, where the bridge has a length set to be 1.98 m (with a relative error of 1%), a cross section width of 0.29 m (with a relative error of 3.33%), and a height of 0.098 m (with a relative error of 2%) in this example, so as to obtain a target domain dataset $T_2(X,Y)$ according to steps 1 and 2 under the condition of the working condition (1) and the working condition (2), where the target domain is free of labels, and for later verification of an effect of the method, a label is also set here, and Y is the same as the source domain; and step 5.3: take an influence of environmental noise in actual measurement as a working condition (3), simulate the working condition (3) by adding noise $D_{noise} \sim N(0,\sigma^2)$ obeying Gaussian distribution with a mean value of 0 and a variance of $\sigma^2$ into the bridge finite element model, where in this example, $D_{noise} \sim N(0, 0.1^2)$, that is, add noise $D_{noise} \sim N(0,\sigma^2)$ into the normalized acceleration response signal matrix $[\bar{a}_1, \ldots, \bar{a}_c, \ldots, \bar{a}_C]^T$, so as to obtain a target domain dataset $T_3(X,Y)$ according to steps 1 and 2 under the conditions of the working condition (1), the working condition (2) and the working condition (3), where the target domain dataset is free of labels, and for later verification of an effect of the method, a label is also set here, and Y is the same as the source domain;

step 6: construct a domain adversarial transfer learning neural network, where the domain adversarial transfer learning neural network includes: a feature extractor $G_f$, a label predictor $G_y$, and a domain classifier $G_q$;

the feature extractor $G_f$ includes $e_1$ convolution layers, a LeakRelu layer is added to each convolution layer, a normalization layer and a maximum pooling layer are added between every two convolution layers, convolution kernels of the convolution layers have a size of $k_1$, the number of $h_1$, and a step length of $s_1$, and convolution kernels of the maximum pooling layers have a size of $k_2$ and a step length of $s_2$, where in this embodiment, $e_1$ is 6, the convolution kernels have the size $k_1$=16, the number $h_1$ of the convolution kernels is 32, 32, 64, 64, 128 and 128 in sequence, the step length $s_1$=1, and the convolution kernels of the maximum pooling layers have the size of $k_2$=4 and the step length of $s_2$=4;

the label predictor $G_y$ is composed of $e_2$ full connection layers, and a LeakRelu layer is added between each full connection layer, where in this example, $e_2$ is 3, a vector dimension flattened by the above feature extractor is 2048, the input of the full connection layers is 2048, 256 and 128 in sequence, and the final output is 11;

the domain classifier $G_q$ is composed of $e_3$ full connection layers, and a ReLU layer and a normalization layer are added between each full connection layer, where in this example, $a_3$ is 3, a vector dimension flattened by the above feature extractor is 2048, the input of the full connection layers is 2048, 1024 and 256 in sequence, and the final output is 2;

step 7, preprocess data, divide the source domain dataset S(X,Y) and the target domain dataset $T_i(X)$, i=1, 2, 3 into a source domain training set $Ds_{tra}$, verification set $Ds_{val}$, and test set $Ds_{test}$ and a target domain training set $Dt_{tra}$, verification set $Dt_{val}$ and test set $Dt_{test}$ separately according to a proportion of 7:1:2, where the divided test set is used for an application stage, to check the effectiveness of the method, such that training set sample size: verification set sample size: test set sample size in each of the two dataset is =0.7:0.1:0.2=5544:792:1584;

step 8, perform a training and verification stage, where a training flow diagram is shown in FIG. 3;

step 8.1: randomly extract P=64 source domain samples $X_s=(A_{s1}, \ldots, A_{sp}, \ldots, A_{s64})$, $Y_s=(y_1, \ldots, y_p, \ldots, y_{64})$ and target domain samples $X_t=(A_{t1}, \ldots, A_{tp}, \ldots, A_{t64})$ from the source domain training set $Ds_{tra}$ and the target domain training set $Dt_{tra}$ each time as a small batch to be input a domain adversarial network and then trained until all the samples of the source domain training set $Ds_{tra}$ and the target domain training set $Dt_{tra}$ are extracted; where $A_{sp}$ represents the p-th source domain sample of the source domain samples in a small batch; and $y_p$ is a label corresponding to the p-th sample of the source domain samples, and $A_{tp}$ represents the p-th target domain sample of the target domain samples in a small batch;

step 8.2: map the p-th source domain sample $A_{sp}$ and the target domain sample $A_{tp}$ in a small batch into a source domain feature vector $f_{sp}$ and a target domain feature vector $f_{tp}$ by means of the feature extractor $G_f(A,\theta_f)$ respectively; where the A is the source domain sample and target domain sample, and $\theta_f$ represents parameter vectors of all layers in mapping;

step 8.3: map the source domain feature vector $f_{sp}$ by means of the label predictor $G_y$ to obtain a prediction label $\hat{y}_p=G_y(f_{sp},\theta_y)$, where $\theta_y$ represents a mapping parameter of the label predictor $G_y$;

step 8.4: compute a loss $L_y(\hat{y}_p,y_p)$ of the label predictor by using equation (1):

$$L_y(\hat{y}_p,y_p)=-y_p \log(\hat{y}_p) \quad (1)$$

step 8.5: set a domain label $Q_S=(q_{s1}, \ldots, q_{sp}, \ldots, q_{sP})$ for the source domain sample $X_s=(A_{s1}, \ldots, A_{sp}, \ldots, A_{sP})$; and set a domain label $Q_t=(q_{t1}, \ldots, q_{tp}, \ldots, q_{tP})$ for the target domain sample $X_t=(A_{t1}, \ldots, A_{tp}, \ldots, A_{tP})$, $q_{sp}$ and $q_{tp}$ represent the domain label corresponding to the p-th source domain sample $A_{sp}$ and the domain label corresponding to the p-th target domain sample $A_{tp}$ respectively, $q_{sp}=0$, and $q_{tp}=1$;

step 8.6: input the source domain feature vector $f_{sp}$ and the target domain feature vector $f_{tp}$ into the domain classifier $G_q(f,\theta_q)$ for mapping, to obtain a prediction domain label $\hat{q}_p$, where f represents the source domain feature vector and the target domain feature vector, and $\theta_q$ represents a mapping parameter of the domain classifier $G_q$;

step 8.7: compute a loss $L_q(\hat{q}_p,q_p)$ of the domain classifier by using equation (2):

$$L_q(\hat{q}_p,q_p)=-q_p \log(\hat{q}_p) \quad (2)$$

where in equation (2), $q_p$ is a domain label corresponding to the p-th sample in a small batch;

step 8.8: establishing a global objective function $E(\theta_f,\theta_y,\theta_q)$ by using equation (3):

$$E(\theta_f, \theta_y, \theta_q) = \sum_{p=1\ldots P}^{q_p=0} L_{ty}^p(\theta_f, \theta_y) - \lambda \sum_{p=1\ldots P} L_{tq}^p(\theta_f, \theta_q) \quad (3)$$

where in equation (3), $L_y^p$ and $L_q^p$ represent a label classifier loss function and a domain classifier loss function calculated by means of the p-th sample in a small batch respectively, $\lambda$ represents measurement of a weight between the two targets; and $\lambda$ represents measurement of a weight between two targets, the domain classifier needs to identify a source domain and a target domain as far as possible, to form an adversarial relation with the feature extractor, such that the greater loss is better, which is not facilitates the solution of the entire loss, and a negative sign is added before the domain adversarial loss;

step 8.9: use a standard stochastic gradient descent (SGD) solver to carry out gradient descent search on saddle point parameters of equations (4) and (5), where SGD optimizer parameters are set as follows: a learning rate is set to be 0.01, and momentum is set to be 0.9, so as to obtain a saddle point parameter $\hat{\theta}_f,\hat{\theta}_y,\hat{\theta}_q$ when the global objective function $E(\theta_f,\theta_y,\theta_q)$ is converged to the current optimum;

$$(\hat{\theta}_f, \hat{\theta}_y) = \arg\min_{\theta_f,\theta_y} E(\theta_f, \theta_y, \hat{\theta}_q) \quad (4)$$

$$\hat{\theta}_q = \arg\max_{\theta_q} E(\hat{\theta}_f, \hat{\theta}_y, \theta_q) \quad (5)$$

where in equations (4) and (5), $\hat{\theta}_f,\hat{\theta}_y,\hat{\theta}_q$ represent mapping parameters of the feature extractor, the label predictor and the domain classifier respectively when the global objective function $E(\theta_f,\theta_y,\theta_q)$ is converged to an optimal state, at the saddle point, the parameters $\theta_q$ of the definition domain classifier minimize a definition domain classification loss (because they come in with a negative sign), while the parameters $\theta_y$ of the label predictor minimize a label prediction loss, and the feature mapping parameters $\theta_f$ minimize a label prediction loss (that is, the features are discriminative) while maximizing a domain classification loss (that is, the features have domain invariance);

step 8.10: repeat steps 8.2-8.9 to complete training of the domain adversarial transfer network by all small batches, and finally obtain a saddle point parameter $\hat{\theta}_f,\hat{\theta}_y,\hat{\theta}_q$ when the global objective function $E(\theta_f,\theta_y,\theta_q)$ is converged to be optimal and an optimal network model; and step 8.11: perform a validation stage:

verify a label prediction correct rate index of the optimal network model based on the source domain verification set $Ds_{val}$ and the target domain verification set $Dt_{val}$, indicate, under the condition that the label prediction correct rate index reaches a threshold, that training of the domain adversarial transfer learning network is completed, save the mapping parameter $\hat{\theta}_f,\hat{\theta}_y,\hat{\theta}_q$ when the global objective function $E(\theta_f,\theta_y,\theta_q)$ is converged to the optimal state, and otherwise, return to steps 8.1-8.10 for retraining, and repeat steps 8.1-8.10 for 64 times, such that the verification set correct rate of each group of working conditions basically tends to a threshold; and step 9: an application stage is performed:

take the $T_i(X,Y)$ test set $Dt_{test}$ as input in an application process as shown in FIG. 4, compute the label prediction correct rate in the trained domain adversarial network, and summarize the correct rate of the samples of the test set $Dt_{test}$, where in order to show superiority of the method, a traditional convolutional neural network result is used for comparison in this example, and the final result is shown in FIG. 5.

What is claimed is:

1. A bridge damage identification method considering uncertainty, comprising:

step 1: constructing a bridge acceleration response dataset;

step 1.1: determining a geometric material parameter of a bridge, establishing a bridge finite element model, dividing the bridge finite element model into units and numbering the units as [1, 2, 3, . . . , n] in sequence, numbering nodes between the units as [1, 2, 3, . . . , n−1] in sequence, and arranging accelerometers at the nodes between the units;

step 1.2: constructing a bridge lossless dataset in a bridge lossless state:

firstly, applying a Gaussian distributed random load once to the node 1, and obtaining an acceleration response signal matrix $[a_1, \ldots, a_c, \ldots, a_C]^T$ of each node between the units through a Newmark-β method, wherein $a_C$ is an acceleration response signal with a length of w at a c-th node between the units, C is a number of the accelerometers, and C=n−1;

step 1.3: normalizing acceleration response signals of all the nodes, to obtain a normalized acceleration response signal matrix $[\bar{a}_1, \ldots, \bar{a}_c, \ldots, \bar{a}_C]^T$; wherein $\bar{a}_c$ represents a normalized acceleration response signal at the c-th node;

step 1.4: randomly intercepting the normalized acceleration response signal matrix $[\bar{a}_1, \ldots, \bar{a}_c, \ldots, \bar{a}_C]^T$ according to a length of $\tilde{w}$, to obtain an acceleration response matrix segment $A=[\tilde{a}_1, \ldots, \tilde{a}_c, \ldots, \tilde{a}_C]^T$ of the bridge when the random load is applied to the node 1, and taking the acceleration response matrix segment as a sample; wherein $\tilde{a}_c$ represents the normalized acceleration response signal with the length of $\tilde{w}$ at the c-th node;

step 1.5: repeatedly applying m times of Gaussian distributed random load to the node 1 between the units, and performing steps 1.2-1.4 for processing, to obtain m samples; and step 1.6: processing the nodes between the units in sequence according to steps 1.2-1.5, to obtain the acceleration response matrix segment of the bridge when the random load is applied to each node between the units, wherein a total of $j_1$=m×(n−1) samples form the bridge lossless dataset;

step 2: constructing a bridge damage dataset:

simulating unit damage in a mode of reducing stiffness of one unit, and setting t different reduction coefficients to simulate damage grades;

step 2.1: selecting a damage grade at the unit 1 for damage simulation, and processing each node between the units according to steps 1.2-1.6 when the unit 1 is at the current damage grade, to obtain an acceleration response matrix segment of the bridge under the current damage grade of the unit 1;

step 2.2: obtaining, according to step 2.1, acceleration response matrix segments of the bridge under all the damage grades of the unit 1, with a total of t×(n−1)×m damage samples; and step 2.3: processing all the units in sequence according to steps 2.1-2.2, to obtain acceleration response matrix segment samples of the bridge under different damage grades of each unit, with a total of $j_2$=t×(n−1)×m×n damage samples to form the bridge damage dataset;

step 3: setting labels $Y=[y_1, \ldots, y_l, \ldots, y_L]$ for the bridge lossless dataset and the bridge damage dataset, wherein the $y_l$ represents a label corresponding to an l-th sample, L is a total number of the samples, and $L=j_1+j_2$; and $y_l \in [0, 1, 2, \ldots, n]$, wherein $y_l$=0 represents the bridge lossless state corresponding to the l-th sample, and $y_l$=1, 2, . . . , n represents a serial number of a damaged unit of the bridge corresponding to the l-th sample;

step 4: combining the bridge lossless dataset and a label of the bridge lossless dataset with the bridge damage dataset and a label of the bridge damage dataset to obtain a source domain dataset S(X,Y) with a label, wherein X represents a union set of the bridge lossless dataset and the bridge damage dataset, $X=[A_1, \ldots, A_l, \ldots, A_L]$, and $A_l$ represents an l-th combined sample;

step 5: simulating a real structure of the bridge by adding uncertainty to the bridge finite element model;

step 5.1: taking uncertainty of stiffness of the bridge as a working condition (1), and simulating the working condition (1) by multiplying stiffness of each unit of the bridge finite element model by a random factor δ, wherein the random factor δ obeys Gaussian distribution, then a target domain dataset $T_1(X)$ is obtained according to step 1 and step 2, and the target domain dataset $T_1(X)$ is free of labels;

step 5.2: taking a geometric error and a material error of the bridge as a working condition (2), simulating the material error by changing density and elastic modulus parameters of the bridge finite element model, and simulating the geometric error by changing a length, and a width and a height of a cross section of the bridge of the bridge finite element model, to obtain a target domain dataset $T_2(X)$ according to step 1 and step 2 under conditions of the working condition (1) and the working condition (2), wherein the target domain dataset $T_2(X)$ is free of labels; and step 5.3: taking an influence of environmental noise in actual measurement as a working condition (3), simulating the working condition (3) by adding Gaussian distributed noise $D_{noise}$−(0,σ²) with a mean value being 0 and a variance being σ² into the bridge finite element model, that is, adding noise $D_{noise}$−N(0,σ²) into the normalized acceleration response signal matrix $[\bar{a}_1, \ldots, \bar{a}_c, \ldots, \bar{a}_C]^T$, to obtain a target domain dataset $T_3(X)$ according to step 1 and step 2 under conditions of the working condition (1), the working condition (2) and the working condition (3), wherein the target domain dataset $T_3(X)$ is free of labels;

step 6: constructing a domain adversarial transfer learning neural network, wherein the domain adversarial transfer learning neural network comprises: a feature extractor $G_f$, a label predictor $G_y$ and a domain classifier $G_q$;

the feature extractor $G_f$ comprises $e_1$ convolution layers, a first LeakRelu layer is added to each convolution layer, a first normalization layer and a maximum pooling layer are added between every two convolution layers, convolution kernels of the convolution layers have a size of $k_1$, a number of $h_1$, and a step length of $s_1$, and convolution kernels of the maximum pooling layers have a size of $k_2$ and a step length of $s_2$;

the label predictor $G_y$ comprises $e_2$ full connection layers, and a second LeakRelu layer is added between each full connection layer; and the domain classifier $G_q$ comprises $e_3$ full connection layers, and a Rectified Linear Unit (ReLU) layer and a second normalization layer are added between each full connection layer;

step 7: preprocessing data, dividing the source domain dataset $S(X,Y)$ and the target domain dataset $T_i(X)$, i=1, 2, 3 into a source domain training set $Ds_{tra}$, a source domain verification set $Ds_{val}$, a target domain training set $Dt_{tra}$ and a target domain verification set $Dt_{val}$ separately according to a proportion; and step 8: performing a training and verification stage;

step 8.1: randomly extracting P source domain samples $X_s=(A_{s1}, \ldots, A_{sp}, \ldots, A_{sP})$, $Y_s=(y_1, \ldots, y_p, \ldots, y_P)$ and target domain samples $X_t=(A_{t1}, \ldots, A_{tp}, \ldots, A_{tP})$ from the source domain training set $Ds_{tra}$ and the target domain training set $Dt_{tra}$ each time as a small batch to be input a domain adversarial network and then trained until all samples of the source domain training set $Ds_{tra}$ and the target domain training set $Dt_{tra}$ are extracted; wherein $A_{sp}$ represents a p-th source domain sample of the source domain samples in the small batch; and $y_p$ is a label corresponding to the p-th sample of the source domain samples, and $A_{tp}$ represents a p-th target domain sample of the target domain samples in the small batch;

step 8.2: mapping the p-th source domain sample $A_{sp}$ and the target domain sample $A_{tp}$ in the small batch into a source domain feature vector $f_{sp}$ and a target domain feature vector $f_{tp}$ by the feature extractor $G_f(A,\theta_f)$ respectively; wherein the A is the source domain sample and the target domain sample, and $\theta_f$ represents parameter vectors of all layers in mapping;

step 8.3: mapping the source domain feature vector $f_{sp}$ by the label predictor $G_y$ to obtain a prediction label $\hat{y}_p=G_y(f_{sp},\theta_y)$, wherein $\theta_y$ represents a mapping parameter of the label predictor $G_y$;

step 8.4: computing a loss $L_y(\hat{y}_p,y_p)$ of the label predictor by using equation (1):

$$L_y(\hat{y}_p,y_p)=-y_p \log(\hat{y}_p) \tag{1}$$

step 8.5: setting a domain label $Q_S=(q_{s1}, \ldots, q_{sp}, \ldots, q_{sP})$ for the source domain sample $X_s=(A_{s1}, \ldots, A_{sp}, \ldots, A_{sP})$; and setting a domain label $Q_t=(q_{t1}, \ldots, q_{tp}, \ldots, q_{tP})$ for the target domain sample $X_t=(A_{t1}, \ldots, A_{tp}, \ldots, A_{tP})$ wherein $q_{sp}$ and $q_{tp}$ represent the domain label corresponding to the p-th source domain sample $A_{sp}$ and the domain label corresponding to the p-th target domain sample $A_{tp}$ respectively, wherein $q_{sp}=0$, and $q_{tp}=1$;

step 8.6: inputting the source domain feature vector $f_{sp}$ and the target domain feature vector $f_{tp}$ into the domain classifier $G_q(f,\theta_q)$ for mapping, to obtain a prediction domain label $\hat{q}_p$, wherein f represents the source domain feature vector and the target domain feature vector, and $\theta_q$ represents a mapping parameter of the domain classifier $G_q$;

step 8.7: computing a loss $L_q(\hat{q}_p,q_p)$ of the domain classifier by using equation (2):

$$L_q(\hat{q}_p,q_p)=-q_p \log(\hat{q}_p) \tag{2}$$

wherein in equation (2), $q_p$ is a domain label corresponding to the p-th sample in the small batch;

step 8.8: establishing a global objective function $E(\theta_f,\theta_y,\theta_q)$ by using equation (3):

$$E(\theta_f, \theta_y, \theta_q) = \sum_{p=1\ldots P}^{q_p=0} L_y^p(\theta_f, \theta_y) - \lambda \sum_{p=1\ldots F} L_q^p(\theta_f, \theta_q) \tag{3}$$

wherein in equation (3), $L_y^p$ and $L_q^p$ represent a label classifier loss function and a domain classifier loss function calculated by the p-th sample in the small batch respectively, and $\lambda$ represents measurement of a weight between two targets;

step 8.9: using a standard stochastic gradient descent (SGD) solver to carry out gradient descent search on saddle point parameters of equation (4) and equation (5) to obtain a saddle point parameter $\bar{\theta}_f,\bar{\theta}_y,\bar{\theta}_q$ when the global objective function $E(\theta_f,\theta_Y,\theta_q)$ is converged to a current optimum;

$$(\hat{\theta}_f, \hat{\theta}_y) = \arg\min_{\theta_f,\theta_y} E(\theta_f, \theta_y, \hat{\theta}_q) \tag{4}$$

$$\hat{\theta}_q = \arg\max_{\theta_q} E(\hat{\theta}_f, \hat{\theta}_Y, \theta_q) \tag{5}$$

wherein in equation (4) and equation (5), $\hat{\theta}_f,\hat{\theta}_y,\hat{\theta}_q$ represent mapping parameters of the feature extractor, the label predictor and the domain classifier respectively when the global objective function $E(\theta_f,\theta_y,\theta_q)$ is converged to an optimal state;

step 8.10: repeating steps 8.2-8.9 to complete training of the domain adversarial transfer network by all small batches, and finally obtaining a saddle point parameter $\hat{\theta}_f,\hat{\theta}_y,\hat{\theta}_q$ when the global objective function $E(\theta_f,\theta_y,\theta_q)$ is converged to the optimal state and an optimal network model; and step 8.11: performing a validation stage:

verifying a label prediction correct rate index of the optimal network model based on the source domain verification set $Ds_{val}$ and the target domain verification set $Dt_{val}$, indicating, under a condition that the label prediction correct rate index reaches a threshold, that training of the domain adversarial transfer learning network is completed, saving the mapping parameter $\hat{\theta}_f,\hat{\theta}_y,\hat{\theta}_q$ when the global objective function $E(\theta_f,\theta_y,\theta_q)$ is converged to the optimal state, and otherwise, returning to steps 8.1-8.10 for retraining.

* * * * *